United States Patent [19]

Wright et al.

[11] 4,238,838

[45] Dec. 9, 1980

[54] CORE MEMORY WIRING ARRANGEMENT

[75] Inventors: Kurt Wright, Burbank; Thomas J. Gilligan, Rolling Hills Estates, both of Calif.

[73] Assignee: Ampex Corporation, Redwood City, Calif.

[21] Appl. No.: 906,642

[22] Filed: May 16, 1978

Related U.S. Application Data

[63] Continuation-in-part of Ser. No. 732,928, Oct. 15, 1976, Pat. No. 4,096,583, and Ser. No. 3,718, Jan. 15, 1979.

[51] Int. Cl.³ .............................................. G11C 5/06
[52] U.S. Cl. ......................................... 365/69; 365/207
[58] Field of Search ................................... 365/69, 196

[56] References Cited

U.S. PATENT DOCUMENTS

| 3,305,846 | 2/1967 | Amemiya | 365/69 |
| 3,864,672 | 2/1975 | Ingelaere | 365/196 |

OTHER PUBLICATIONS

Proceedings-Fall Joint Computer Conference 1966, pp. 267–280.

*Primary Examiner*—James W. Moffitt
*Attorney, Agent, or Firm*—Robert G. Clay

[57] ABSTRACT

A large, 2 wire, 2-½D core memory includes four, 1K (1024) by 1280, core frames with 1280 Y conductors each stringing and inductively coupling a column of 1024 cores in each of the four frames and 4K orthogonal X conductors each stringing and inductively coupling one row of 1280 cores. A word position within the memory is defined by 5 pairs of Y conductors, a corresponding X conductor from each frame, and selection of relative current directions in the Y conductors. Reading of a 20 bit word is accomplished with 5 sense amplifiers in four rapid succession read sub-operations. Digit sense conductor noise recovery time is minimized by arranging for balanced, predictable delta noise on each digit sense conductor of a pair and by providing a multiple digit sense conductor pair crossover arrangement which results in a balancing of image current coupling into adjacent digit sense conductor pairs.

8 Claims, 14 Drawing Figures

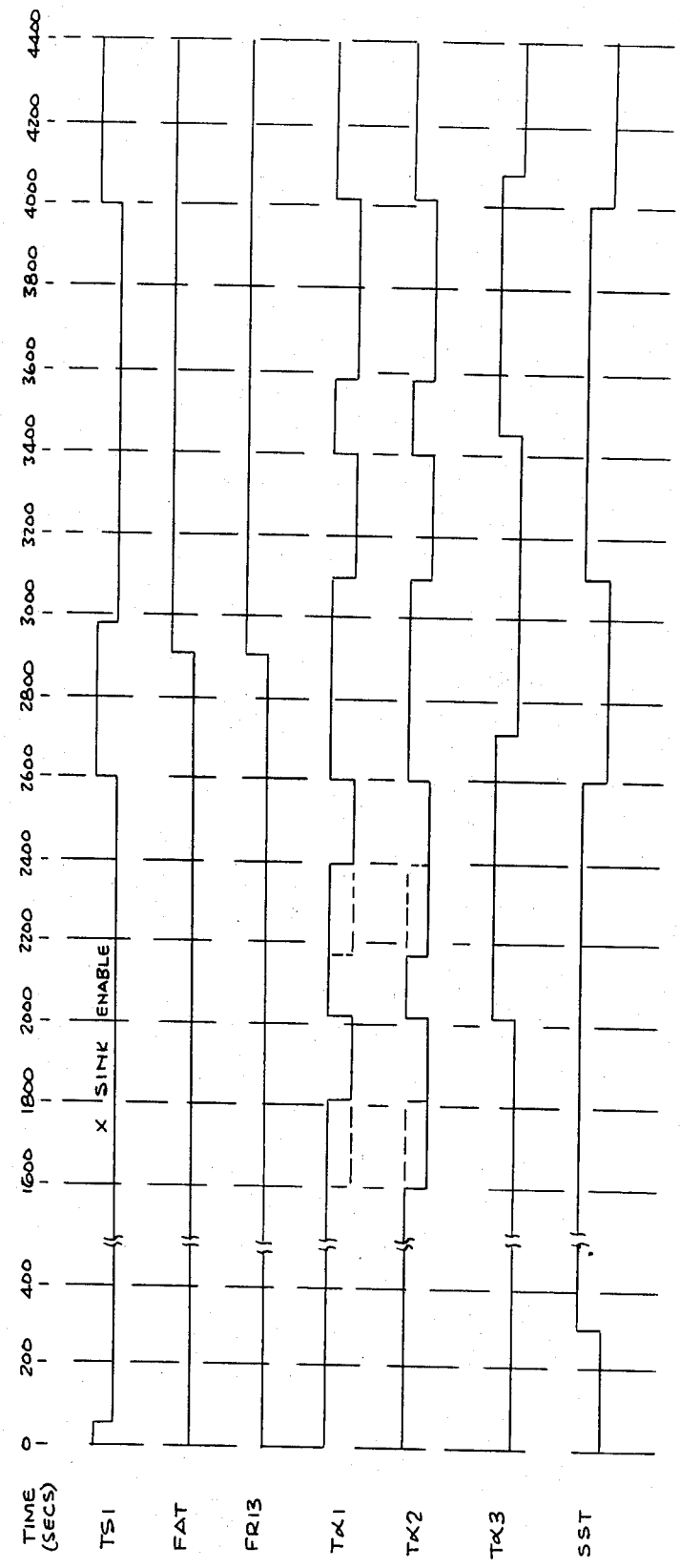

CORE MEMORY WIRING ARRANGEMENT

CROSS REFERENCE TO RELATED APPLICATIONS

This application is a continuation-in-part of application Ser. No. 732,928, filed Oct. 15, 1976, now U.S. Pat. No. 4,096,583 and reissue application Ser. No. 3,718, filed Jan. 15, 1979.

BACKGROUND OF THE INVENTION

1. Field of the Invention

This invention relates to large capacity 2 wire core memories and more particularly to such memories which internally perform serial data cycles with overlapping drive currents and which have shared drive circuitry.

2. Description of the Prior Art

Two wire, 2½D core memories utilize two oppositely oriented cores for each intersection of an X current and a Y current pair. The direction and relative polarities of the three partial select currents determine which of the two cores is selected and the polarity of the resulting EMF switching force. The X current adds to a Y current at the selected core and cancels the other Y current at the unselected core of an oppositely oriented core pair.

Two wire, 2D memories have the advantage of reducing stack wiring costs in comparison to three wire, 3D memories, but this advantage is typically overshadowed by increased costs for current matrix and sense circuitry. The 2½D memory organization helps to reduce the cost of the electronics relative to 2D memory configurations but heretofore has not been sufficient to make the arrangement competitive with three wire 3D arrangements.

SUMMARY OF THE INVENTION

A large two wire core memory in accordance with the invention includes four 1K by 1280 2½D memory core frame matrices with 1280 Y conductors inductively coupled to a column of cores in each matrix. Each of 4K X conductors inductively couples only one row of cores in one core frame matrix. Control and sense circuitry functions to select 5 pairs of Y conductors or a total of 10 conductors from among the 1280 Y conductors and a corresponding X conductor in each matrix. The 40 cores thus identified are reduced to a 20 bit word by proper selection of the X current polarity in conjunction with the oppositely oriented core pair 2½D core configuration.

Reading is accomplished in four rapid sequence read subcycles as 5 sense amplifiers each sense core output switching pulses differentially across a pair of Y conductors continuously carrying currents, while a corresponding X conductor of each frame is sequentially energized with a partial select read current. One X conductor is energized during each of the four rapid sequence subcycles. The 4 sequential sets of read data signals from the 5 sense amplifiers are stored in 4 bit parallel in-parallel out shift registers for assembly as either two 10 bit parallel data bytes or one 20 bit parallel data word. Pairs of X currents are overlapped during sequential read subcycles to permit an increased read subcycle rate by initiating the X current for subcycle 2 while the X current for subcycle 1 continues. The X currents for subcycle 1 and 2 terminate simultaneously at the end of read subcycle 2. A single X read current is generated for subcycle 3 and continues as another X read current for read subcycles 4 is generated. The X read currents for subcycles 3 and 4 terminate simultaneously.

A write portion of a memory cycle is accomplished with each current of the selected 5 pairs of Y currents being individually controlled in accordance with data information stored in the data shift registers, during each of two time sequential memory write subcycles. During the first write subcycle two corresponding X currents are simultaneously energized, one in each of two frames. Each X current is additive at an addressed core location with a different current (if present) from each Y conductor pair and cancels the other current of each Y conductor pair. During the second write subcycle the two other X currents are energized in the other 2 frames and the selected 10 Y currents are responsive to the remaining 10 bits of the data word.

The digit-sense conductors of the memory are arranged in multi-conductor groups with two subgroups in each group. The conductors of one subgroup cross the conductors of another subgroup at at least one point between a pair of frames. Cancellation of image current coupling noise as well as delta noise is thus achieved to enable faster memory operation.

BRIEF DESCRIPTION OF THE DRAWINGS

A better understanding of the invention may be had from a consideration of the following detailed description, taken in conjunction with the accompanying drawings, in which:

FIGS. 6A through 6D are timing diagrams that are helpful in understanding the operation of the memory system shown in FIG. 1;

DETAILED DESCRIPTION

Figure 1A:
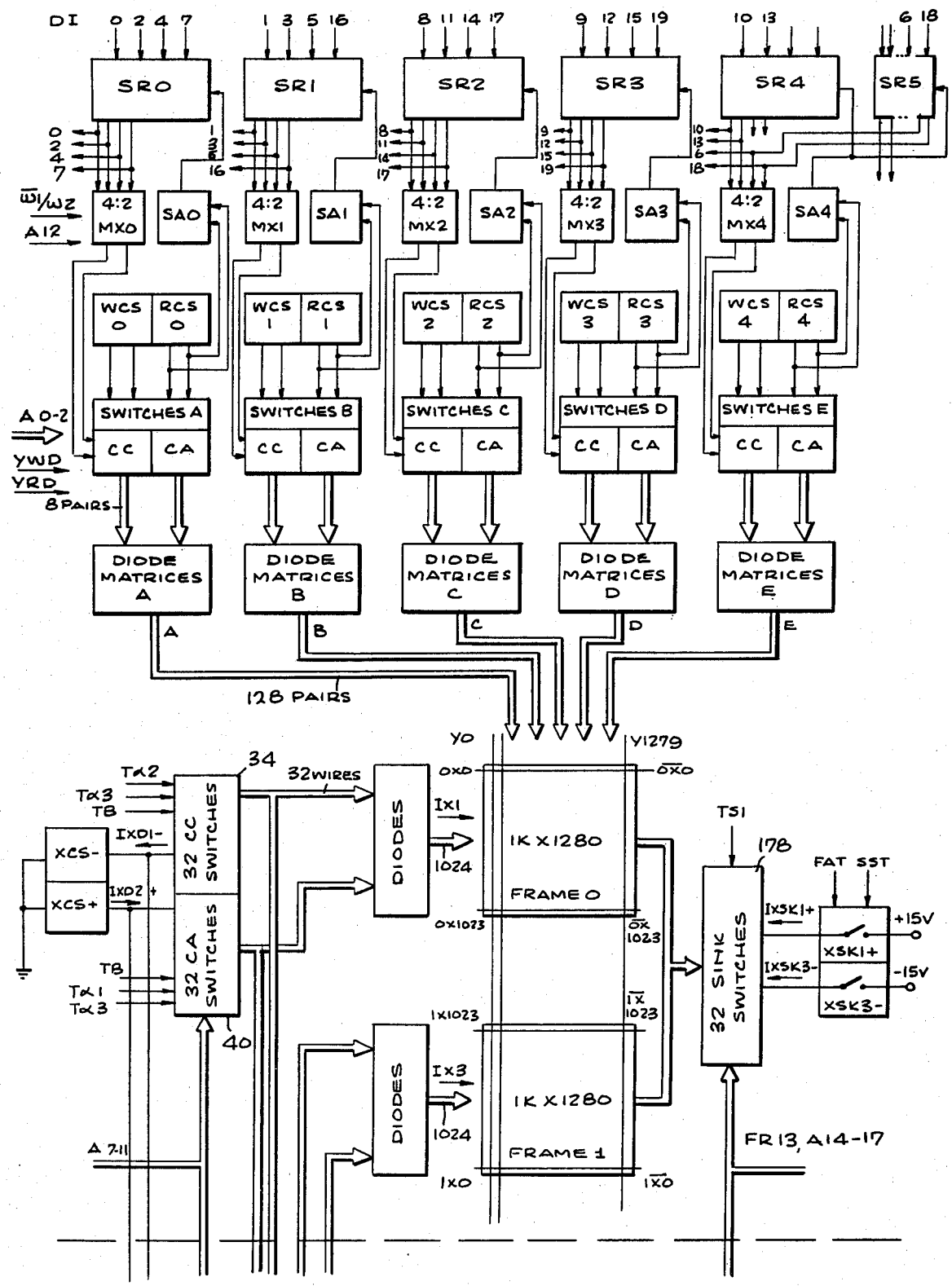
FIGS. 1A through 1C are block diagrams representing a core memory system in accordance with the invention.
Figure 1B:
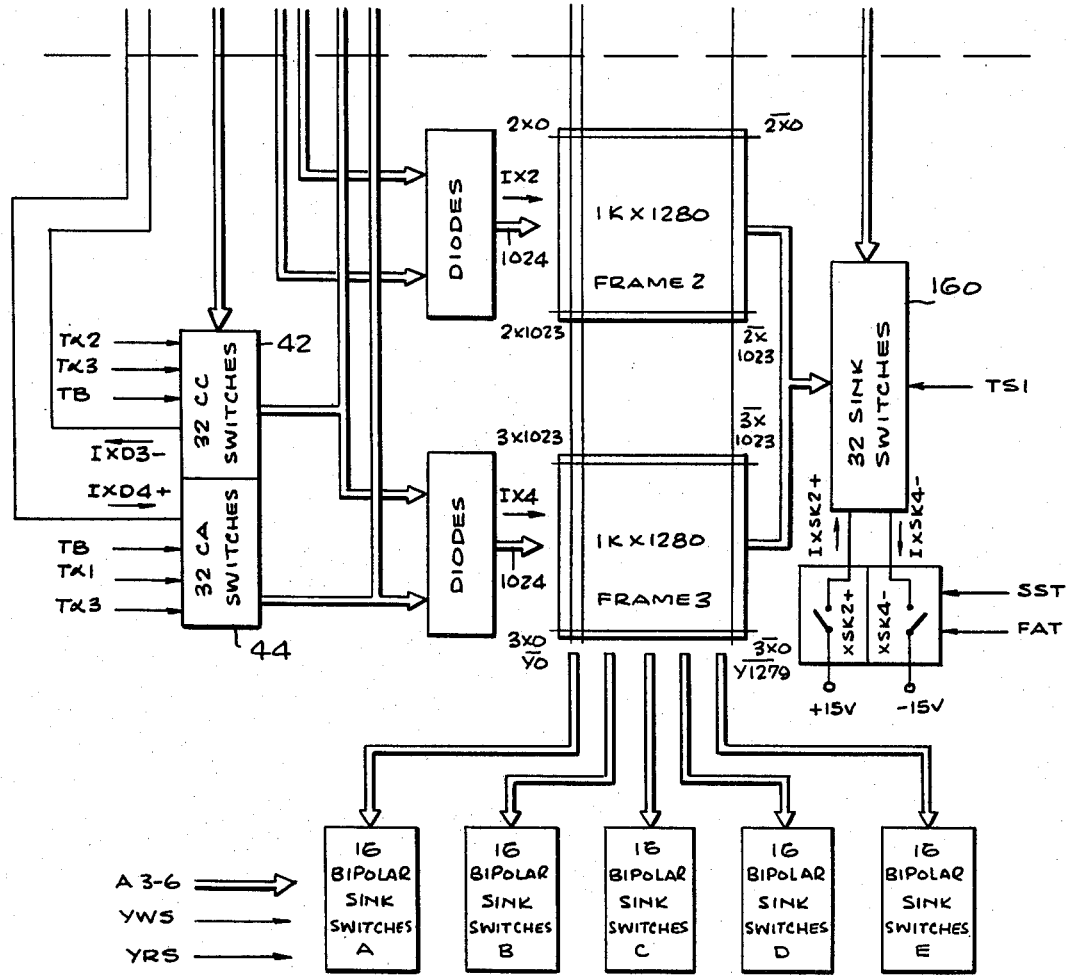
Figure 1C:
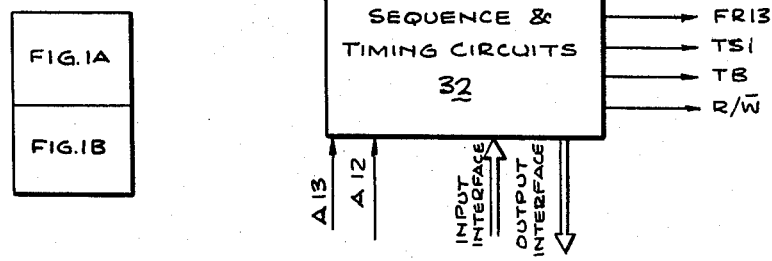

Referring to FIG. 1, a core memory 30 includes four frames designated herein frame 0 through frame 3. Each frame includes an array or matrix of magnetic memory cores which are switchable between two stable states of magnetization. Each frame contains 1,310,720 cores arranged in 1280 vertical columns and 1024 horizontal rows. Thus the 4096 X conductors each inductively couple all of the cores in a different row containing 1280 cores. In the Y direction, each of 1280 Y conductors inductively couples a column of cores from each frame or a total of 4096 cores. The Y conductors are grouped into pairs with the cores along each pair of Y conductors being oppositely oriented at each intersection of a pair of Y conductors with an X conductor. When similar polarity currents are passed through the pair of Y conductors, a selected polarity X current is coincident with one of the Y currents but is anticoincident with the other. A core memory matrix that is commonly known as two wire, $2\frac{1}{2}D$ is thus formed for each of the 5 bit positions spread on the four frames.

It will be appreciated by those skilled in the art that FIG. 1 shows a somewhat simplified representation of the core memory 30 with the four frames stacked end-to-end in a vertical column, with X drive circuitry on the left, with X sink circuitry on the right, with Y data and drive circuitry on top and with Y sink circuitry on the bottom. However, as the core memory 30 is actually built, conventional techniques may be employed to fold the four frames, to alternate end terminations so that for half the X conductors the drive end may be on the right and the sink end on the left while for half the Y conductors the drive end may be on the bottom and the sink end on the top. Furthermore, it is not necessary that the two conductors of a Y conductor pair be in immediate proximity. In addition, inverting data input and data output buffers may be employed so that data received from the processing system is inverted before storage by memory 30 and then reinverted as it is output back to the data processing system. Other conventional techniques may of course be employed in fabricating the memory 30.

Externally, the memory 30 appears to contain 262,144 (256K) words with 20 bits in each word. The memory 30 can accommodate each word as 20 bits in parallel or as two 10 bit bytes containing bits 0–7, 16 and 18 in the first byte and bits 8–15, 17 and 19 in the second byte. Data in information, DI, and data out information, DO, is communicated in parallel via data conductors to and from 6 four bit shift registers designated SRO–SR5. Shift registers SR0, SR1 and SR5 are associated with byte 1 while shift registers SR2, SR3 and SR4 store data for byte 2.

The Y conductors are divided into five data groups designated A–E with 128 pairs of conductors in each group. Except for differences necessitated by different data states, the five data groups operate in parallel and simultaneously.

Five 4:2 multiplexers designated MX0–MX4 receive four bit parallel outputs from the shift registers SR0–SR5 and output a different selected two bits for each write subcycle to a corresponding write current course WCS0–WCS4 for the respective data group. During reading and writing, shift registers SR4 and SR5 operate in parallel as if each were the shift register for data group E. These shift registers are implemented as two separate shift registers only for convenience in inputting or outputting data as two separate bytes. The two left-most bits of register SR4 contain data for byte 2 while the two right-most bits of shift register SR5 contain data for byte 1. Bits 10 and 13 of byte 2 can thus be parallel loaded into register SR4 without disturbing bits 6 and 18 of byte 1 previously loaded into register SR5.

Writing into the memory is accomplished in two write subcycles. A signal $\overline{W1}/W2$ provided by sequence and control circuits 32 causes multiplexers MX0–MX4 to select a left-most pair of output bits from a corresponding shift register during subcycle 1 and a right-most pair of bits during subcycle 2.

The multiplexers MX0–MX4 must also selectively transpose the pairs of data bits between the left and right hand conductor pair for each bit position during a write subcycle. Address bit A12 determines whether a given data bit is written into the righthand core or the lefthand core of a pair of oppositely oriented core pairs. If address bit A12 is zero, during write subcycle 1 data bit 0 is written into the lefthand core of frame 0 while data bit 2 is written into the righthand core of frame 2. If address bit A12 is a 1, data is written into the righthand core of frame 0 and the lefthand core of frame 2. Thus, in order for bit 0 to be written into the frame 0 position, multiplexer MX0 must transpose data bits 0 and 2 so that data bit 0 controls current in the righthand Y conductor of the Y conductor pair. Data bit 2 is then coupled to control the current in the lefthand conductor.

Alternative methods might also be utilized to permit the data information to be properly assembled after it is read. For example, the order of reading frames 0,2 and 1,3 might be selectively transposed. It should also be kept in mind that if the physical location of the drive and sink ends are alternated as is commonly done, the required transposition of data bit positions may be further affected by X and Y address locations within each frame.

During write subcycle 1 signal $\overline{W1}/W2$ goes low to select a left-most pair of data signals from shift registers SR0–SR5 for data groups A–E respectively. These data signals are selectively transposed as explained above and used to control the presence or absence of partial select Y currents as the 10 Y currents control the writing of 10 data bits into frames 0 and 2. Similarly, during write subcycle 2 signal W1/W2 goes high and the two righthand bits of each set of shift registers is used to control the Y currents while 10 data bits are written into frames 1 and 3.

A pair of write current sources WCS0–WCS4 and a pair of read current sources RCS0–RCS4 for each bit position are high impedance circuits that limit the magnitude of the Y currents to approximately half that required for the full drive switching of a core. Actual energization for the currents is provided by connection to voltage sources of +15 V for write currents and −15 V for read currents at the sink ends.

During a write portion of a cycle pairs of series Y switches within the common cathode (CC) portion of switches A–E response to the pair of data signals from multiplexers MX0–MX4 respectively to enable or disable the 10 Y currents in response to the data information. If a 1 is to be written a series switch is closed and a partial select Y current is allowed to flow in an associated Y conductor of a selected Y conductor pair and if a 0 is to be written, the corresponding Y series switch opens to prevent current flow.

The common cathode (CC) drive switches operate during a write portion of a memory cycle and the common anode (CA) drive switches operate in a similar manner during a read portion of a memory cycle to help select the pairs of Y conductors that may carry Y partial select currents. Each Y drive switch matrix includes 8 pairs of common cathode switches, with each switch being connected to the common cathodes of 10 decoder diodes within the diode matrices A–E. There are also 8 pairs of common anode switches with each switch being connected to the common anodes of 16 decoder diodes. During a write portion of a cycle, in each bit position one pair of drive switches of the 8 pairs of common cathode switches is closed in response to address signals A0–A2 and Y write drive timing signal YWD. Similarly one pair of common anode drive switches is closed during a read portion of a memory cycle in response to the address bits A0–A2 and a Y read drive timing enable signal YRD.

At the sink end of the Y conductors the two conductors of each conductor pair are connected together with each of the 16 pairs that are associated with a pair of common anode switches and a pair of common cathode switches being connected to a different 1 of 16 bipolar sink switches for a corresponding data group. Selection of one pair of drive switches and one sink switch thus selects one pair of Y conductors within each data group for the conduction of current. The 16 bipolar switches for each data group operate completely in parallel and could be combined into a single set of 16 bipolar sink switches if desired. However, in the present example of the current carrying requirements and physical displacements of the conductors are such that it was more convenient and economical to provide a separate set of sink switches for each data group. Because the sink switches operate in parallel, a single read cycle decoder may be employed to respond to the four address bits 3–6 to select one of 16 outputs when enabled by a low active state of a Y read sink timing enable signal YRS. Similarly, a single write decoder may be employed to respond to address bits 3–6 to select 1 of 16 outputs when enabled by an active low state of a Y write sink timing enable signal YWS. Each output of the write sink decoder is coupled to close one transistor switch to connect 8 pairs of Y conductors to +15 volts in each of the 5 data groups. Similarly, each output of the read sink decoder is connected to close a transistor switch for each data group to connect 8 pairs of Y conductors therein to −15 volts.

A read portion of a memory cycle consists of four time sequential memory read subcycles during which the five read current sources RCS0–RCS4 each generate a pair of identical partial select Y read currents continously throughout the entire read portion of the cycle. The common anode portions (CA) of five drive switch matrices A–E provide a connection for the pairs of read currents between the proper common anodes of addressed diode matrices A–E and the read current source pairs. The five pairs of partial select Y read currents thus pass from the current sources at the driver end of the memory at the top of FIG. 1 to the common anode (CA) switches which enable one of 8 sets of Y conductor pairs, each containing 32 pairs of Y conductors for each bit position. The one of 8 sets is selected in response to address bits A0–A2. For each bit position only one of the 16 pairs of Y conductors selected by the Y CA drive switches to −15 V. Current is thus established in only one pair of Y conductors for each bit position as determined by address signals A0–A6.

Five sense amplifiers designated SA0–SA4 sense core switching output voltages differentially across the pair of selected Y lines through which partial select currents are generated by the read current sources RCS0–RCS4, respectively. Because only one sense amplifier is provided for each bit position only 5 bits can be sensed at one time and a read portion of a memory cycle requires four time sequential memory read subcycles with five bits being read during each read subcycle.

Upon initiation of the five pairs of Y partial select read currents, substantial differential mode noise appears on the five pairs of current conductors and a delay of about 1600 nanoseconds is imposed while this differential mode noise attenuates to a level much less than the 20–25 millivolt logic 1 core switching signal peak magnitude. A partial select X current of a read polarity is then passed through an address selected X conductor of frame 0. This current is coincident with one Y partial select current from each pair of Y currents, and for each of the five data groups a core switches if a 1 has been previously written therein. The switching of a core generates a core output switching voltage signal across the pair of selected Y conductors for each bit position. This signal is detected by the sense amplifiers SA0–SA4 which generate either a logic 1 or logic 0 for data bits 0, 1, 8, 9 and 10 that is entered into the shift input of shift registers SR0–SR5, respectively. Subsequently, during read subcycle 2 the X current for frame 0 remains active while an opposite polarity partial select X current is passed through one conductor of frame 2 at a corresponding address location. This current is coincident with a Y read current of each of the five read current pairs in the conductors opposite the conductors carrying the currents that were coincident with the X current in frame 0. Five more memory cores within frame 2 thus receive a full read energization and the information states for data bits 2, 3, 11, 12 and 13 are detected by the read amplifiers and entered through the shift input of the shift registers as the five bits previously detected during read cycle 1 are shifted left one position. At the end of subcycle 2, the X currents in frames 1 and 2 are terminated and then read subcycle 3 begins with an X current being generated in frame 1. The 5 data bits 4, 5, 14, 15 and 6 of frame 1 are detected and shifted into the shift registers and at the end of read subcycle 3, read subcycle 4 begins with a partial select read current in frame 3 being energized. During read subcycle 4, bits 7, 16, 17, 19 and 18 are detected from the five data groups and shifted into the shift registers SR0–SR5. At the end of the fourth read subcycle, 20 bits have been shifted into shift registers SR0–SR5 and are available for outputting to an associated data processing system. Read subcycle 4 completes a read portion of a memory cycle and the X currents are terminated in frames 1 and 3 and the Y read currents are terminated.

Figure 2:
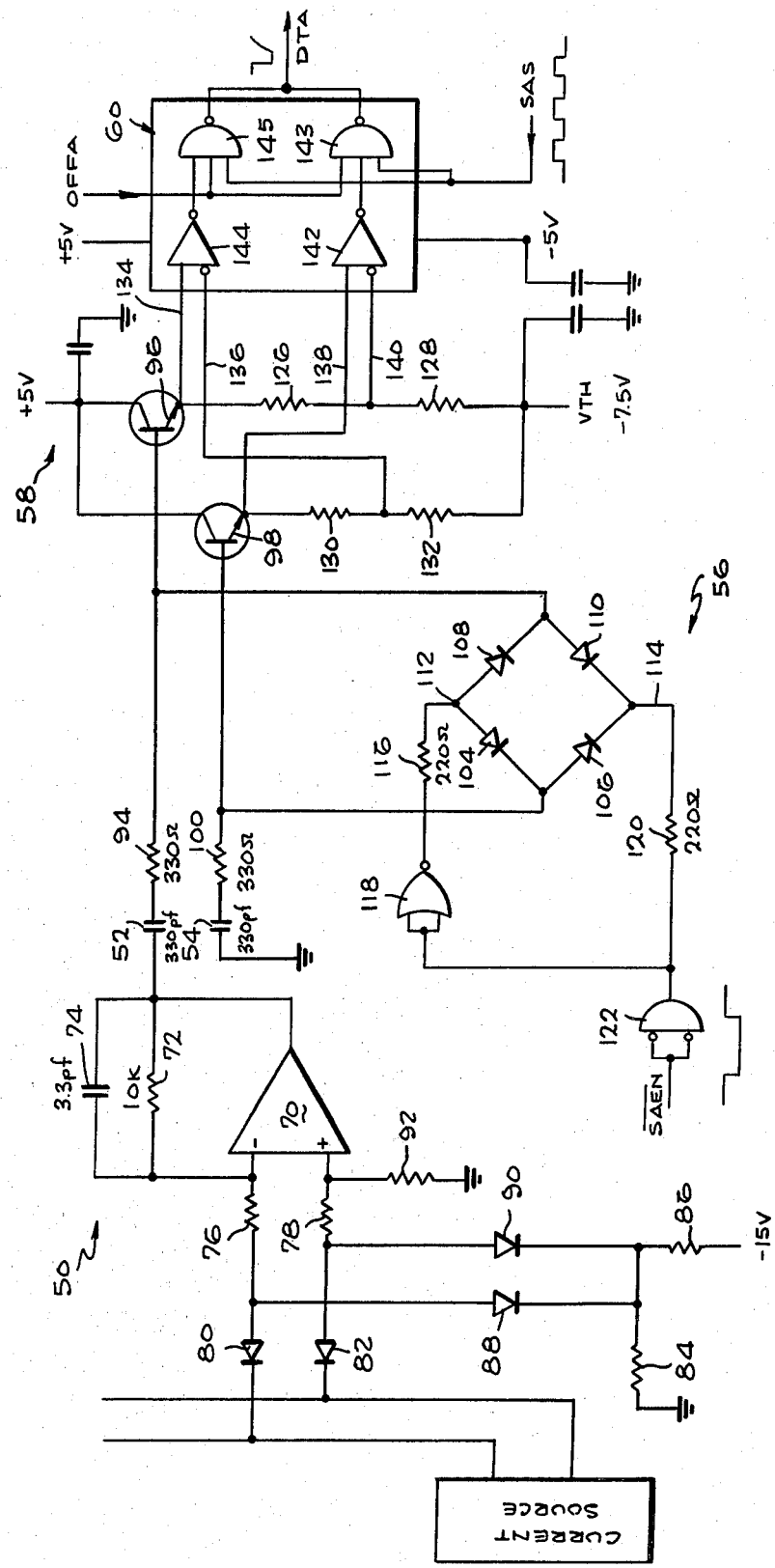
FIG. 2 is a schematic representation of an improved sense amplifier used in the memory system shown in FIG. 1.

As shown in FIG. 2, the sense amplifiers SA0–SA4, as represented by amplifier SA0, are specially built to permit the sensing of a small differential voltage pulse across a pair of current source terminals of memory 30. Typically, a sense amplifier is required to sense differentially across a pair of conductors which carry no current during a read operation and which are coupled through matched impedances to ground adjacent the sense amplifier inputs. However, in the configuration of core memory 30, the Y conductors are energized by coupling to −15 volts at their sink ends with the read current sources RCS0–RCS4 providing a high impedance to ground. Because the impedances through the decoding switches and memory core frames cannot be exactly matched for each Y current pair, and because long term changes in impedances of current paths would soon cause mismatches even if there were initial matching, steady state voltage differences of up to + or −4 volts may occur across the sense amplifier inputs prior to the receipt of a core signal. The sense amplifier SA0 is able to compensate for these DC pedestal voltage variations, which may be large with respect to the magnitude of the 20-25 millivolt core switching signal.

Sense amplifier SA0 includes a preamp input stage 50, steady state differential mode voltage compensation capacitors 52, 54, a diode bridge 56, an intermediate amplifier stage 58 and a dual polarity comparator 60.

Preamplifier 50 includes an A 715 operational amplifier 70 having a feedback circuit including a 10K resistor 72 and a 3.3 picofarad capacitor 74 coupled between the output and negative input of operational amplifier 70. An input circuit that protects the input of operational amplifier 70 from large transitions in input voltage applied thereto at a 1K resistor 76 providing the negative input and a 1K resistor 78 providing the positive input includes a diode 80 coupled to carry current from a terminal of resistor 76 opposite the negative input to a first current source output conductor of read current source RCS0, and a diode 82 connected to conduct current from a terminal of resistor 78 opposite the positive input and a second output current conductor of the pair of current conductors from current source RCS0. The input circuit also includes a pair of voltage divider resistors 84, 86 coupled in series between ground and −15 volts to provide a reference voltage of −6.8 at the junction therebetween. A diode 88 is coupled to conduct current from the junction of resistor 76 and the anode of diode 80 to the junction of resistors 84 and 86. Similarly, a diode 90 is coupled to conduct current from the junction of resistor 78 and the anode of diode 82 to the junction of resistors 84 and 86. A 10K resistor 92 is connected between the + input to operational amplifier 70 and ground.

When a read portion of a cycle is not being executed, the voltage on the pair of current source conductors for current source RCS0 goes positive to reverse bias diodes 80 and 82 and to permit both the plus and minus input to operational amplifier 70 to be clamped at approximately −6.2 volts by conduction through diodes 88 and 90. This is slightly more positive than the steady state negative voltage that exists on the pair of current conductors during a read portion of a memory cycle of memory 30. It is thus assured that during a read portion of a memory cycle diodes 88 and 90 are reverse biased while forward conduction occurs through diodes 80 and 82 to insure a low impedance coupling of resistor 76 to the first current conductor and a low impedance coupling of resistor 78 to the second current conductor. Any differential switching pulse voltages which appear across the pair of current conductors is thus communicated directly to operational amplifier 70 to be amplified by a factor of −10.

The 330 μf capacitor 52 is coupled in series with a 330 ohm resistor 94 between the output of operational amplifier 70 and the base of a transistor 96 which is one of a pair of matched NPN transistors 96, 98. The 330 microfarad capacitor 54 is coupled in series with 330 ohm resistor 100 between ground and the base of transistor 98. Bridge circuit 56 includes a first pair of diodes 104, 106 coupled to conduct current from a positive input terminal 112 to a negative input terminal 114. Similarly, a pair of diodes 108, 110 is coupled in series to conduct current from positive terminal 112 to negative terminal 114. The junction of diodes 104 and 106 is coupled to the base of transistor 98 while the junction of diodes 108 and 110 is coupled to the base of transistor 96. The positive terminal 112 is coupled through a 220 ohm resistor 116 to the output of a TTL NOR gate 118. While the negative terminal 114 is coupled through a 220 ohm resistor 120 to the output of a TTL NOR gate 122. NOR gate 122 is coupled to operate as an inverter for input signal $\overline{SAEN}$ and the output thereof is also coupled to drive all inputs to NOR gate 118, which also operates as an inverter gate.

The collectors of transistors 96 and 98 are coupled together to +5 volts. The base of transistor 96 is coupled through series connected 100 ohm resistor 126 and 10K resistor 128 to a threshold voltage of VTH = −10 V. Similarly, the base of transistor 98 is coupled through series coupled 100 ohm resistor 130 and 10K resistor 132 to voltage VTH. A first non-inverting input of comparator 60 is coupled to the base of transistor 96 while a first inverting input 136 of comparator 60 is coupled to the junction of resistors 130 and 132. Similarly, a second non-inverting input 138 of comparator 60 is coupled to the base of transistor 98 while a second inverting input 140 is coupled to the junction of resistors 126 and 128.

In operation, signal $\overline{SAEN}$ is high at the beginning of a read cycle to cause bridge circuit 56 to operate to charge capacitors 52 and 54 so as to maintain matched voltages at the base inputs to transistors 96 and 98. The 330 ohm resistor 94 is selected to provide an adequate load impedance for operational amplifier 70 to prevent oscillations. During a read cycle the steady state output voltage for operational amplifier 70 may be anywhere within a typical range of volts and as a consequence considerable charging of capacitors 52 and 54 may be required to equalize the voltages at the base inputs to transistors 96 and 98. The capacitors 52 and 54 must be small enough to permit rapid equalization of the output voltages, but at the same time large enough to pass four successive amplified switching pulses without appreciable charging. The value of 330 picofarads has been selected as a reasonable compromise. Within 1600 nanoseconds into the read portion of a memory cycle, the inputs and outputs of operational amplifier 70 will have stabilized at steady state levels and capacitors 52 and 54 will have been charged to equalize the voltages at the base inputs to transistors 96 and 98. At this time signal $\overline{SAEN}$ goes low to reverse bias the diode bridge 56 and effectively remove it from the circuit during the sensing of the output switching pulses.

Voltage VTH, in cooperation with the voltage divider network including resistors 126, 128, 130 and 132, provides a bias for the two pairs of differential inputs to comparator 60 to control the threshold sensing level. In the present example, VTH is −10 volts to provide a 0.1 V steady state bias across each of the pairs of input terminals. Thus, if a differential negative switching pulse is provided across the two current conductors of approximately 25 millivolts, this is amplified by operational amplifier circuit 70 to provide an output pulse of 0.25 volts to the base of transistor 96. Transistor 96 is coupled to an emitter follower configuration to provide a differential voltage relative to the emitter of transistor 98 of approximately 0.25 volts. Input lead 140 thus receives a voltage of 0.25 V less than 0.1 V drop across resistor 126 or +0.15 V relative to a noninverting input lead 138 of comparator 60. A comparator stage 142 within comparator 60 responds to this differential by enabling a NAND gate 143 to generate a data signal output while further enabled by a sense amplifier strobe signal SAS and a normally present enable signal OFFA for sense amplifier SAO. If the core switching pulse had been of the opposite polarity, the emitter of transistor 96 would have become 0.25 volts negative relative to the emitter of transistor 98 and input lead 134 would have become 0.15 volt negative relative to input lead 136. Comparator stage 144 would have responded to this voltage differential by providing a positive output to enable NAND gate 145 and cause the output of comparator 60 to go active low to indicate the detection of data. Four output switching pulses of alternating polarities may thus be sensed in rapid succession between time 1600 nsec and time 2600 nsec when signal $\overline{\text{SAEN}}$ again goes high to cause circuit 56 to conduct.

Figures 3, 4:
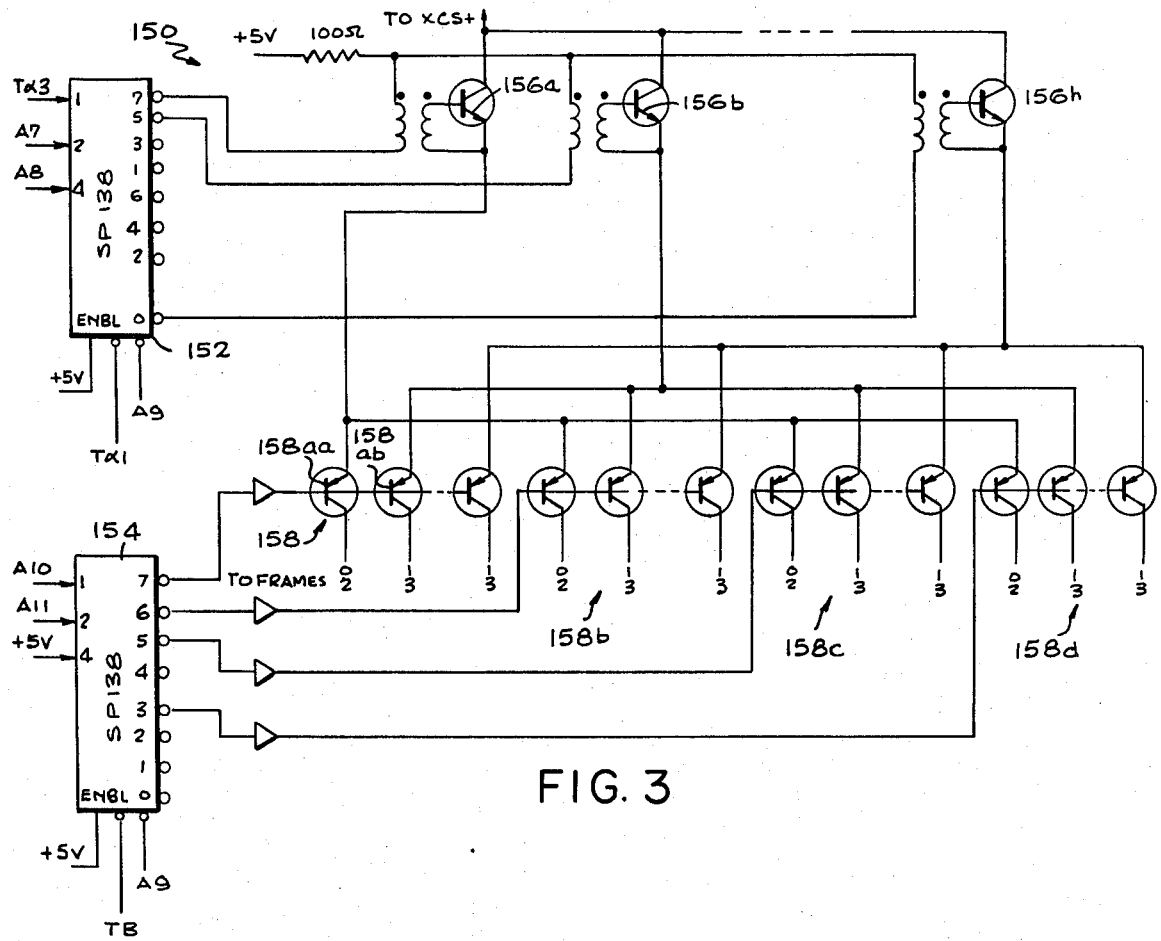
FIG. 3 is a schematic representation of a first portion of a common anode X drive switch circuit for the memory system shown in FIG. 1.
FIG. 4 is a schematic representation of a portion of an X sink switch circuit for the memory system shown in FIG. 1.

Referring now to FIGS. 1 and 3, the X drive switches 34, 40, 42 and 44 are functionally organized as shown in FIG. 1. However, the physical construction is simplified and the manufacturing costs are reduced by actually implementing the 32 common anode switches 40 and the 32 common anode switches 44 as a single set of 64 common anode drive switches. The common anode drive switches, which themselves form part of an X conductor drive selection matrix in conjunction with the X sink switches, are in turn selected by a decoder matrix. While the 64 common anode drive switches could be selected by an 8×8 decoder matrix, for convenience of manufacture it has been found desirable to employ two independent 8×4 decoder matrices. Similarly, the common cathode switches 34 and 42 are implemented as a common 8×8 matrix that is physically split into two 8×4 matrices of X drive switches.

As shown in FIG. 3, a drive switch decoder matrix 150 which is the first of two common anode drive switch decoder matrices, includes an SP138 3 bit binary decoder 152, an SP138 3 bit binary decoder 154, eight pre-drive decoder switches 156a–156h, and four drive switch sets 158a–158d, each including eight PNP transistor drive switches. The outputs of decoders 152 and 154 are numbered to indicate the terminal that is selected by the three binary coded inputs that are weighted as indicated.

One of the drive switches 158 is closed only when address selection signal A9 is at logic 0 and timing and address signal T$\alpha$1 is at logic 0 to enable decoder 152 while base timing signal TB is also at logic 0 to enable decoder 154. When both decoders are enabled, address signals A7 and A8 combine with timing address signal T$\alpha$3 to cause one of the eight outputs of decoder 152 to go active low and thereby select one of the pre-drive switches 156a–156h. The selection of a pre-drive switch in turn enables one drive switch from each of the four sets 158a–158d while address selection signals A10 and A11 cause decoder 154 to select one drive switch from the four that have been enabled to thereby select exactly one of 32 drive switches. A second 32 switch common anode drive switch decoder matrix is not shown but is identical to the matrix 150 except that the decoders are connected to be enabled by a logic 1 on address signal A9. Address signal A9 thus determines whether the first or second matrix is selected to permit selection of one of 64 common anode X drive switches. The physical arrangement is thus compatible with the functional arrangement shown in FIG. 1 in which one of 64 common anode drive switches is selected at any given time.

Each of the collectors of the common anode X drive switches 158 connects to the common anodes of 32 decoder diodes for 32 separate X drive conductors in each of two core memory frames. Half of the X drive switches 158 connect to 32 X conductors in frame 0 and 32 X conductors in frame 2 while the other half of the switches 158 connect to 32 X conductors in frame 1 and 32 X conductors in frame 3. For example, decoder switch 158aa couples to 32 diode anodes in frame 1 and to 32 diode anodes in frame 3. Similarly, common anode drive switches such as switch 158ah or switch 158bh connect to the anodes of 32 X decoder diodes for frame 0 and to the anodes of 32 X decoder diodes for frame 2. The signal T$\alpha$3 thus determines whether the common anode X drive switches will enable the passage of current through X conductors of frames 0 and 2 or frames 1 and 3. if signal T$\alpha$3 is at logic 1, X drive current for frames 1 and 3 will be enabled. Similarly, if signal T$\alpha$3 is at logic 0, X drive current for frame 0 and frame 2 will be enabled. Thus, relating FIG. 3 back to FIG. 1, signal T$\alpha$3 determines whether common anode switch group 40 or common anode switch group 44 is selected while signals A7–A9, T$\alpha$1, and TB determine the timing and selection of particular switches within each group.

The 64 common cathode X drive switches 34 and 42 are organized in a manner similar to the common anode X drive switches 40 and 44 except that NPN transistor drive switches are employed and current flows in the opposite direction. The decoders are coupled in a similar manner with address signal A9 determining which set of 32 switches is activated. However, to provide the proper timing and frame selection for the opposite polarity X drive currents, signal T$\alpha$2 is substituted for signal T$\alpha$1 as an enabling input for the decoders corresponding to decoder 152.

The X sink switches are arranged for decoding in a somewhat more straightforward manner. A portion of X sink switches 160 is illustrated in FIG. 4. The X sink switches 160 include four 3 bit binary decoders identical to decoder 162 except that the enable address inputs A16 and A17 are arranged in mutually exclusive combination such that exactly one of the decoders is selected at any one time. Sink timing signal TS1 is connected to partially enable each of the four encoders when at logic 0. Each of the encoders 162 is responsive to binary coded input signals provided by address input signals A14 and A15 and phase referenced address signal FR13. Signal FR13 has the logical function $\overline{\text{FR13}} = \text{A13}$ EXCLUSIVE OR A12 EXCLUSIVE OR R/$\overline{\text{W}}$. Since the portion of the logic function A12 EXCLUSIVE OR R/$\overline{\text{W}}$ determines desired current direction, and since FR13 is connected to the least significant input to decoder 162, an odd or an even output of decoder 162 is selected in accordance with the status of address signal A13 and a desired current direction.

A pair of X sink switches 164, 166 are connected to be energized upon active low status for outputs 0 and 1 of decoder 162 respectively. The sink switches 164, 166 are connected to output sink conductors XS0 and XS1 such that the two sink switches 164 and 166 can provide bidirectional sink switching for each of the pair of outputs for two directions of current flow and thus serve the function of four switches. The collector of each of the X sink switches is diode coupled to positive series sink switch +SK2 while the emitters of each of the X sink switches are diode coupled to negative sink switch −SK4.

Each of the output conductors XS0–XS3 is coupled to 32 X drive conductors in frame 2 and 32 X drive conductors in frame 3. If address and timing conditions arise such that it is desired to provide a positive current (from drive end toward sink end) through sink switch XS1, series sink switch −SK4 is closed and address signals A16, A17, A14 and A15 go high while signal FR13 goes low to select the one output of decoder 162 to turn on transistor 166. Current thus flows through diode 168 transistor 166 and diode 170 to series sink switch —SK4. Alternatively, if it were desired to reverse the current direction on sink switch common line XS1, signal FR13 would be low instead of high and series sink switch +SK2 would be turned on instead of series sink switch —SK4. Current would then flow through diode 172, transistor 164 and diode 174 to X sink conductor XS1. It is thus apparent that selection of transistor 164 enables a positive current on X sink conductor XS0 and a negative current on X sink conductor XS1 while closure of transistor switch 166 enables a positive current on X sink conductor XS1 or a negative current on X sink conductor XS0. Thus, selection of one of the series sink switches +SK2 or —SK4 in conjunction with selection of one of the two transistors 164, 166 determines the direction of current and which one of a pair of X sink conductors the current is generated on.

Though not specifically shown, the decoder circuit 162 has connected thereto four more pairs of transistors and sink switch arrangements identical to the sink switch arrangement for switches 164 and 166 to drive X sink conductors XS2–XS7. In addition, the X sink switches for frames 2 and 3 include three more sets of decoders identical to decoder 122 with four pairs of transistor switches connected thereto. All four decoder circuits corresponding to decoder circuit 162 for the 32 sink switches for frames 2 and 3 are connected to address signals A16 and A17 so as to permit selection of exactly one of the four decoders in response to the state of address signals A16 and A17. 32 X sink conductors are thus provided for the X sink switches 160 and each X sink conductor is connected to 32 X conductors in frame 2 and 32 X conductors in frame 3.

The 32 X sink switches 178 are identical to the 32 X sink switches 160 except that corresponding pairs of adjacent X sink conductors are connected in an interchanged manner. Thus, as indicated in parentheses in FIG. 4, X sink conductor XS33, which corresponds to X sink conductor XS1 is connected as X sink conductor XS0 would be in sink switches 160. Similarly, in X sink switches 178, X sink conductor XS32 is connected as is X sink conductor XS1 for sink switches 160. Thus, as a given X sink conductor is selected by X sink switches 160 for one direction of current, a corresponding X sink conductor within X sink switches 178 is simultaneously selected for an opposite direction of current. The selective closure of X sink series switches XSK1+, XSK2+. XSK3— and XSK4— determines the direction of current flow through the selected X sink conductors.

To further facilitate an understanding of the operation of this invention, the operation of the memory 30 will be described during a read-write cycle. For purposes of this example it will be assumed that the 18 address bits, designated 0–17 are respectfully as follows: 0000 0001 1011 0011 11. One of the key address bits in determining current direction and circuit timing is address bit A12. For purposes of this example this address bit has been selected to be 0 to select the numbered cores shown in FIG. 5.

Figure 5:
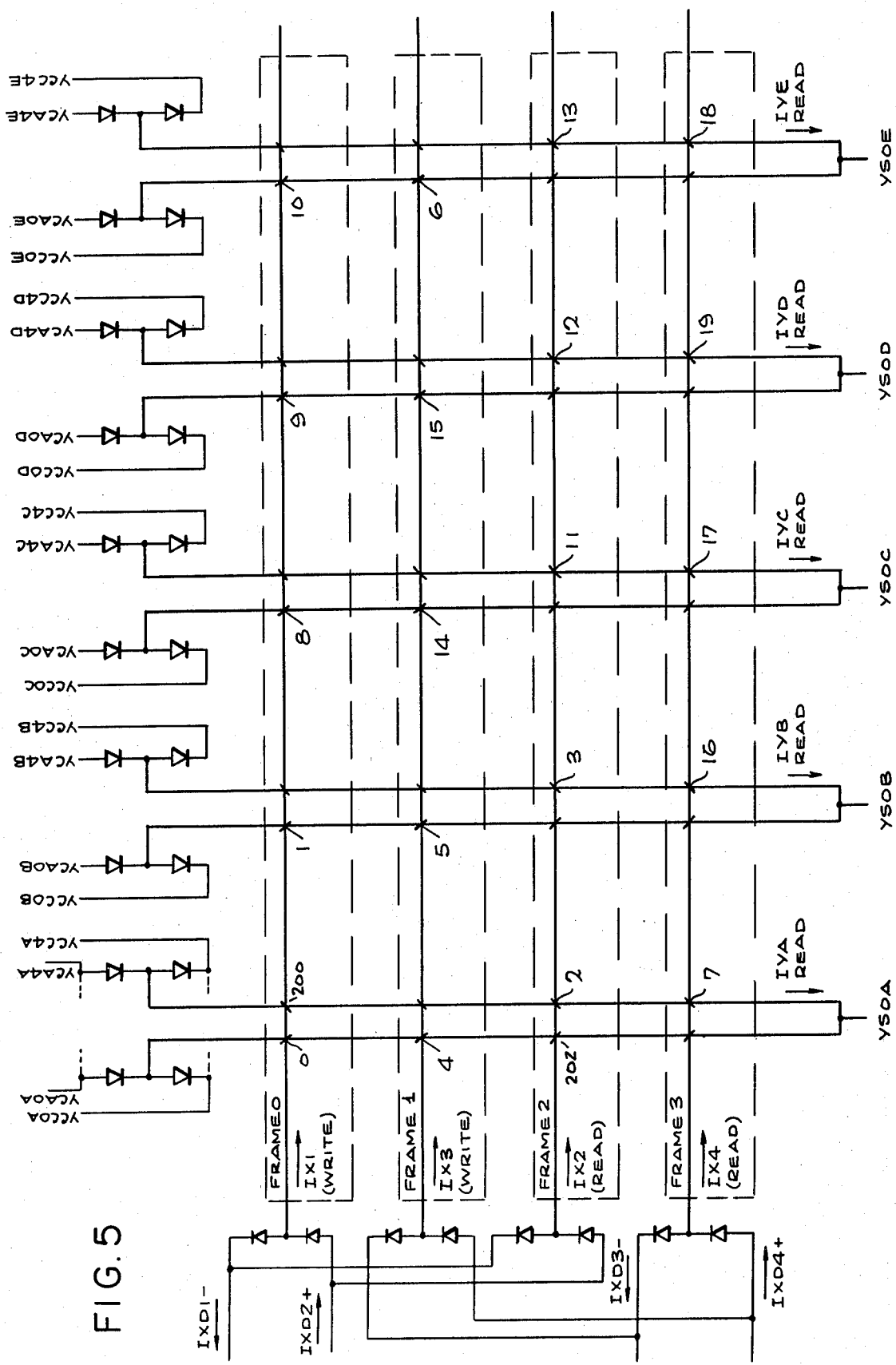
FIG. 5 is a schematic representation of a portion of the core memory system shown in FIG. 1.
Figure 6A:
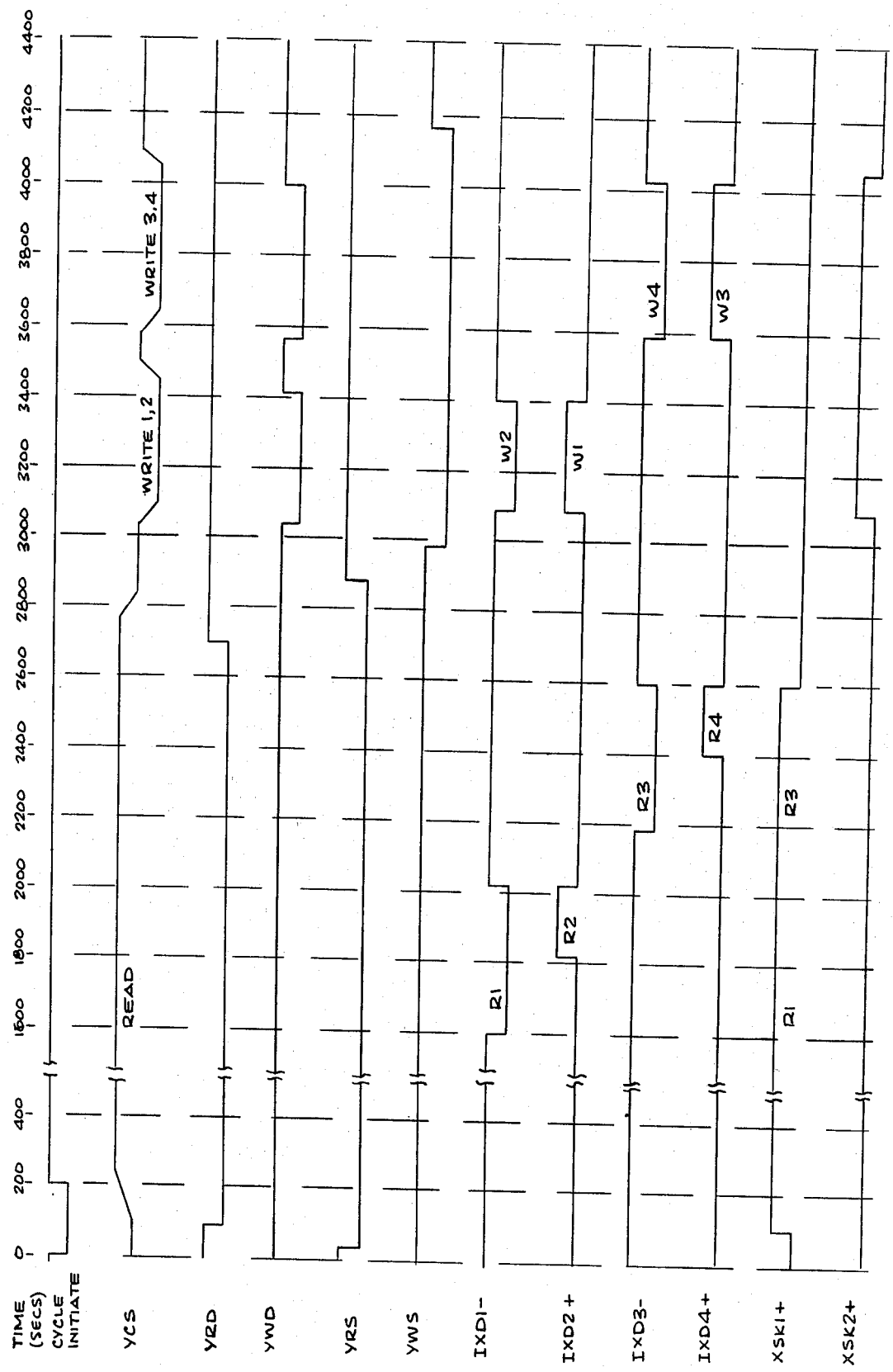
Figure 6B:
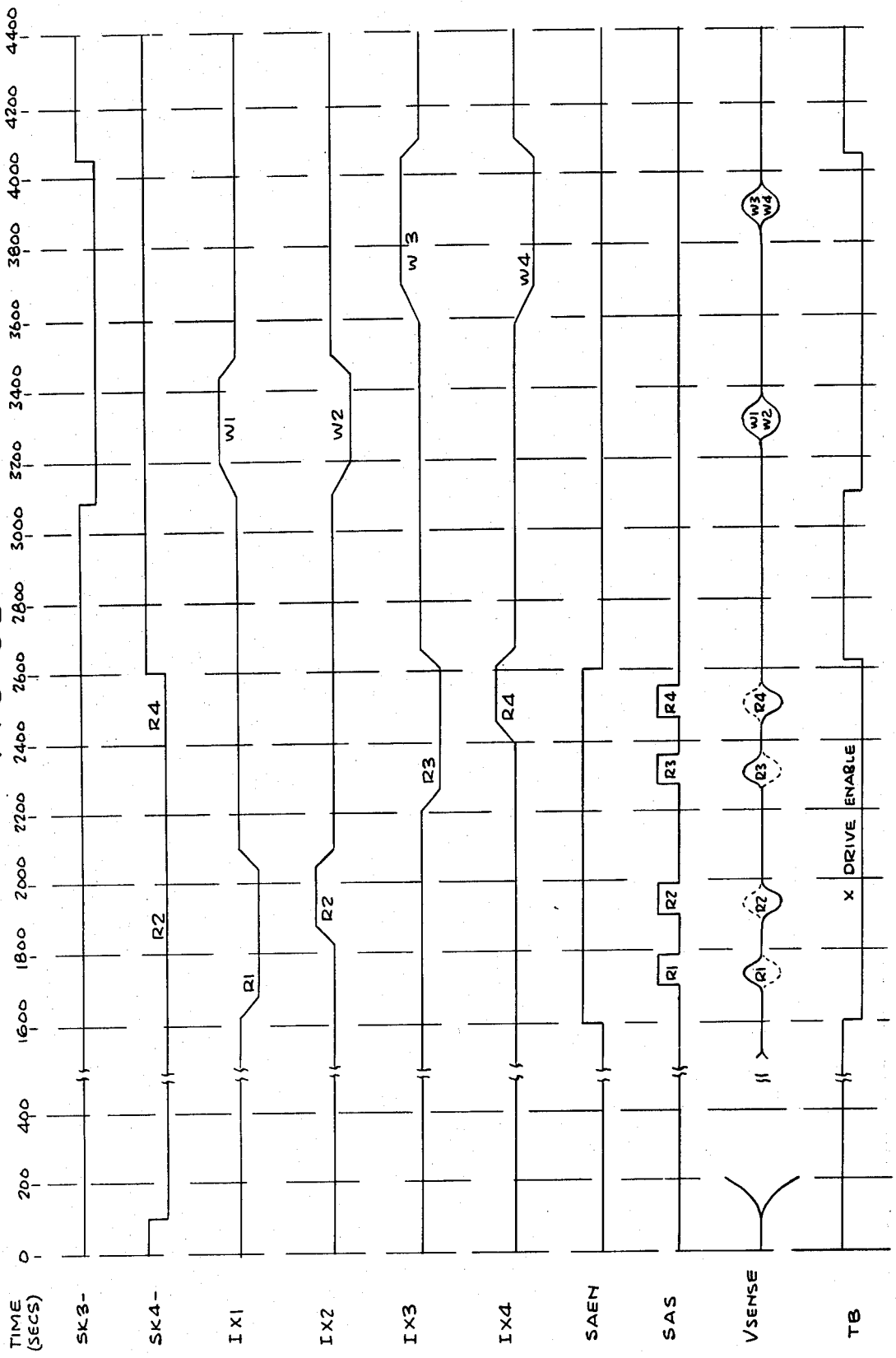

Referring now to FIGS. 5 and 6, a 200 nanosecond cycle initiate pulse starts the read-write cycle at time 0. The Y current control is relatively simple and begins with the Y read sink switches being enabled by signal YRS at time 50 nanoseconds and remaining enabled until time 2880 nanoseconds at the end of a read portion of the cycle. At time 100 nanoseconds, the Y driver circuits are enabled by signal YRD and remain enabled until time 2700 nanoseconds. As indicated by the Y current signal YCS, one pair of Y read currents thus flows from the drive end toward the sink end for each of the 5 bit positions A–E. The Y current rise and fall times are about 100 nanoseconds and are controlled by the Y read drive signal YRD at 120 nsec and 2700 nsec. Similarly, opposite polarity write currents are enabled for a first write subcycle during time 3050 nanoseconds through time 3410 nanoseconds and during time 3580 nanoseconds through time 4000 nanoseconds. Signal YWD enables the Y drive common cathode switches between times 3050 nsec and 3410 nsec for the first write subcycle and between times 3580 and 4000 for the second write subcycle. Signal YWS enables the Y sink switches throughout both write subcycles between times 2980 and 4170 nsec. As explained previously, the information state of data being written determines whether Y current actually flows during a write subcycle.

To enable the proper X read currents, sink switches XSK1+ and XSK4— are turned on at time 100 nanoseconds and remain on until the completion of the fourth read subcycle at time 2600 nanoseconds. When high, phase and timing signal FAT selects X sink series switches XSK2— and XSK3—, but during a read portion of a cycle signal FAT goes low if address bit A12 is 0 to select X sink series switches XSK1+ and XSK4—. Sink timing signal TS1 actually enables the closure of all X sink series switches. The logic functions for these and other pertinent signals are shown in Table I below. To enable reading of frame 0, a negative X read current, IX1, must flow through the selected X conductor of frame 0. This is accomplished by enabling one of the sink switches 178 and one of the common cathode drive switches 34. As noted previously, the X sink switches 178 are identical to those shown in FIG. 4 except that the X sink conductors are connected as indicated in parentheses. In the present example, address signals A14–A17 are respectively 1111 to select either terminal 0 or terminal 1 of decoder 162. Signal FR13 is equal to 0 in the present example during the read cycle and equal to 1 during the write cycle. Output 6 is thus selected to enable transistor 166 and series switch SK2+ in FIG. 4 corresponds to the closed series switch XSK1+, in FIG. 1. Current thus flows from the +voltage supply through transistor 166 to X sink conductor XS33.

TABLE I $\overline{YRD} = R/\overline{W}$ . (100 nsec–2700 nsec)

$\overline{YWD} = \overline{R/\overline{W}}$ . [(3050 nsec–3410 nsec) + (3580 nsec–4000 nsec)]

$\overline{YRS} = R/\overline{W}$ . (50 nsec–2880 nsec)

$\overline{YWS} = \overline{R/\overline{W}}$ . (2980 nsec–4170 nsec)

$FAT = A12 + \overline{R/\overline{W}}$

TABLE I-continued

SAEN = R/$\overline{W}$ . (1600 nsec–2600 nsec)

SAS = R/$\overline{W}$ . [(1710 nsec–1790 nsec) + (1910 nsec–1990 nsec)
  + (2280 nsec–2360 nsec) + (2480 nsec–2560 nsec)]

TB = R/$\overline{W}$ . (1600 nsec–2620 nsec) + $\overline{R/\overline{W}}$ . (3090 nsec–4050 nsec)

TX1 = R/$\overline{W}$ . (50 nsec–2600 nsec) + $\overline{R/\overline{W}}$ . (2980 nsec–4000 nsec)

FR13 = A12 + A13 + $\overline{R/\overline{W}}$

T$\alpha$1 = R/$\overline{W}$ . $\overline{A12}$ . [(1820 nsec–2020 nsec) + (2400 nsec–2600 nsec)]

+ R/$\overline{W}$ . A12 . [(1600 nsec–2020 nsec) + (2170 nsec–2600 nsec)]

+ $\overline{R/\overline{W}}$ . [(3100 nsec–3400 nsec) + (3590 nsec–4020 nsec)]

T$\alpha$2 = R/$\overline{W}$ . $\overline{A12}$ [(1600 nsec–2020 nsec) + (1970 nsec–2600 nsec)]

+ R/$\overline{W}$ . A12 . [(1820 nsec–2020 nsec) + (2400 nsec–2600 nsec)]

+ $\overline{R/\overline{W}}$ . [(3100 nsec–3400 nsec) + (3590 nsec–4020 nsec)]

$\overline{T\alpha 3}$ = R/$\overline{W}$ . (0 nsec–202 nsec) + $\overline{R/\overline{W}}$ . (2720 nsec–3450 nsec)

SST = R/$\overline{W}$ . (300 nsec–2600 nsec) + $\overline{R/W}$ (3080 nsec–4000 nsec)

In order to complete the current path, one of the common cathode X drive switches 34 must also be selected. Signal T$\alpha$2 thus goes low to enable a partial select negative current IX1 starting at time 1600 nanoseconds and continuing through the read 1 and read 2 subcycles. Signal T$\alpha$3 is low during this time period to address decoder 152 in FIG. 3 such that a common cathode X drive switch 34 is enabled rather than one of the common cathode X drive switches 42. At time 1820 nanoseconds, the read 2 subcycle begins with signal T$\alpha$1 going low to enable the common anode X drive switches 44 and 40 while signal T$\alpha$3 is at logic 0 to readdress common anode drive switches 40 within the group 40 and 44. Since signal FAT and SST enable the X sink switches 160 and X series switch XSK4— throughout the read 1-read 4 subcycles positive partial select current IX2 is permitted to flow through a selected conductor of frame 2 to permit the reading of a core within frame 2 for each bit position.

As best shown in FIG. 2, the negative current IX1 in frame 0 is coincident with the lefthand Y current of each Y current pair to permit the reading of bits 0, 1, 8, 9 and 10. Subsequently during read subcycle 2, the positive current IX2 in frame 2 is coincident with the righthand Y current of each Y current pair to permit the reading of bit positions 2, 3, 11, 12 and 13.

At the end of read subcycle 2, the X currents are terminated by the disabling of the X drive switches 34 and 40 as signals T$\alpha$1 and T$\alpha$2 go inactive high. At the same time, signal T$\alpha$3 gores from low to high to cause X drive switches 42 and 44 to be addressed during the read 3 and read 4 subcycles in lieu of X drive switches 34 and 40 which were addressed during the read 1 and read 2 subcycles. After a short time delay to permit the attenuation of any noise generated on the selected pairs of Y conductors resulting from termination of currents IX1 and IX2 and to assure these currents have terminated in the previously energized X conductors in frame 0 and 2, at time 2220 signal T$\alpha$2 goes active low to enable the flow of a negative partial select current IX3 through common cathode X drive switches 42. This current flows through series switch XSK1+ which remains closed during the entire read portion of a cycle and sink switches 178 to cause the reading of data in frame 2 during read subcycle 3. Current IX3 is coincident with the lefthand current of each Y current pair to permit the reading of bit positions 4, 5, 14, 15, and 6 as indicated in FIG. 5.

Current IX3 remains energized as timing signal T$\alpha$1 goes active low at time 2400 nanoseconds to initiate read subcycle 4. Signal T$\alpha$1 enables one of the common anode switches 44 to permit current IX4 to flow from current source XCS+ through common anode switches 44 and frame 3. From frame 3 current IX4 flows through one of the switches 160 which has remained closed and through X sink series switch XSK4— to the −15 volt supply. At time 2600 or shortly thereafter signals T$\alpha$1 and T$\alpha$2 go inactive high to terminate currents IX3 and IX4, signal TB goes inactive high to disable all of the X drive switches, signal SST goes inactive low to disable the series sink switches and signals YRD and YRS go inactive high to inhibit the pairs of Y read currents. Shortly thereafter at time 2770 nanoseconds signal T$\alpha$3 returns to logic 0 to address common cathode and common anode switches 34 and 40 in preparation for the write 1 subcycle and the write portion of the cycle begins at 2980 nanoseconds when signal YWS goes low to enable the Y sink write switches for a write polarity of current opposite the read polarity in the selected pairs of Y conductors. At time 3050 nanoseconds the Y drive switches become enabled by signal YWD and current begins to flow in the selected pairs of Y conductors only if the data associated with each Y conductor as indicated by the outputs of multiplexers MX0–MX4 is logic 1.

At time 2920 nanoseconds signal FAT goes high to cause series sink switches SK2+ and SK3— to be selected and remain selected throughout the 2 write subcycles. At time 2920 signal FR13 also goes high to properly address the sink switches 160 and 178 to account for the reversal of current direction during the write subcycles. At time 2980 signal TS1 goes active low to enable the sink switches 160, 168 and write polarity X currents IX1 and IX2 begin to flow through frames 0 and 2 at time 3090 nanoseconds as signals TB, T$\alpha$1, and T$\alpha$2 go active low and signal SST goes active high to fully enable the X drive switches 34, 40, and the series sink switches XSK2+ and XSK3—.

During the write 1 time interval current IX1 flows in a write direction from current source XCS+ through X drive switches 40, through frame 0, through sink switches 178 and through series sink switch XSK3− to the −15 volts supply. Simultaneously, current IX2 flows in a write direction from the +15 volts supply through sink series switch XSK2+, sink switches 160, through frame 2, and through common cathode switches 34 to current source XCS−. At time 3400 signals Tα1 and Tα2 go high to disable the drive switches 34, 40 and terminate X currents IX1 and IX2 at the end of write subcycle 1. At time 3410 nanoseconds signal YWD goes high to disable the Y write drive switches and terminate the Y currents.

At time 3450 nanoseconds signal Tα3 goes high to address X drive switches 42 and 44 for write subcycle 2 and write subcycle 2 actually begins at time 3580 nanoseconds as signal YWD goes active low to enable the Y drive currents during write subcycle 2. As with write subcycle 1, current actually flows in a given one of 10 selected Y conductors only if a logic 1 is to be written into a bit position corresponding thereto. Also at time 3580, signals Tα1 and Tα2 go active low to enable X drive switches 42, 44 and permit X currents IX3 and IX4 to flow through frames 1 and 3 respectively in opposite directions. Write current IX3 flows from current source XCS+ through common anode switches 44, through frame 1, through sink switches 178 and through series sink switch XSK3− to the −15 volts supply. Simultaneously, current IX4 flows from the +15 volts supply through series sink switch XSK2+, through sink switches 160, through frame 3, and through common cathode switches 42 to current source XCS−. At 4000 nanoseconds or shortly thereafter the memory cycle is terminated with the completion of write subcycle 2. To complete the second write subcycle, signal YWD goes inactive high to disable the Y drive switches, and terminate the Y drive currents while signal YWS goes inactive high to disable the Y sink switches. Disabling of the X drive and sink switches occurs as signal TWB goes inactive high, signal TS1 goes inactive high, signal Tα1 and Tα2 go inactive high, and signal SST goes inactive low. At time 4080 nanoseconds signal Tα3 again goes low to address X drive switches 34 and 40 in preparation for the next memory cycle.

It will be observed that at the end of each memory cycle, whether a read only cycle or a full read/write cycle, half of the unselected cores along any given Y or digit-sense conductor have received as a last X or word current a partial select read current while the other half have received a partial select write current. This is significant in minimizing delta noise recovery time for a digit-sense conductor. Delta noise generated by partial selection of a core depends substantially on the direction of the last preceding partial select current received by the core. If the new current is a read current and the last current was a write current, the delta noise will be about 4 times what it would be if the last current were also a read current. In prior art memories worst case conditions can arise where a first conductor of a Y conductor pair has cores therealong which have all received a last current in the write direction and a second conductor has cores therealong which have all received a last current in the read direction. Consequently, when partial select read currents are passed through the Y conductor pair the first conductor experiences relatively little delta noise while the second conductor experiences much greater delta noise. A substantial delta noise recovery time must then pass before the delta noise imbalance is attenuated sufficiently to permit differential sensing of core switching signals across the conductors.

In arrangements according to the present invention, the cores along any given digit-sense conductor appear in mutually noise cancelling groups of cores in different frames such that the last current which has been received by each core of a group following a memory cycle has been in opposite read/write directions. For example, referring to FIG. 5, at the end of the previously discussed read/write cycle a write current will have passed through a selected X drive wire in each frame as the last current therein. This current will disturb not only the few cores that are being written (which will also receive a partial write Y current) but also the hundreds of cores therealong which have not been selected. However, for each left to right write current as in frames 0 and 1, there is a right to left write current as in frames 2 and 3. Because each memory cycle involves two cancelling pair currents to read or write all four frames this relationship always exist to assure an optimum worst case noise pattern.

For instance, a write operation involving the set of X drive conductors shown in FIG. 5 would result in a last read disturb on core 200 balanced by a last write disturb on core 2 and a last read disturb on the core next to core 4 balanced by a last write disturb on core 7. Similarly, a last write disturb of core 0 is balanced by a last read/write disturb of core 202 and a last write disturb in core 4 will be balanced by a last read disturb in the core next to core 7. Consequently, should Y pair YSOA be selected for a read operation, in the lefthand conductor two cores will produce write disturb delta noise and two will produce read disturb delta noise. The same circumstance will prevail in righthand conductor of the selected pair. Each conductor of the pair will thus experience half read and half write delta noise to present equal and mutually cancelling delta noise to the sense amplifier.

It will be appreciated that this inherent self cancellation applies not only to the selected Y conductors for a memory cycle, but to all of the Y conductors in the memory because one physical direction of current in a given frame is balanced by an opposite physical direction of current in another frame whether a read or a write operation is involved. This condition also prevails regardless of which set of four X drive conductors is selected because they always occur in opposed physical direction pairs to select cores on different ones of the digit sense Y conductor pairs. As a result of this compensatory pairing of X drive currents, substantially equal, intermediate level delta noise always appears on both conductors of a digit sense Y conductor pair in response to a partial selection digit read current. The worst case data patterns of prior memories do not exist for memories as disclosed herein and the balanced noise condition minimizes worst case noise recovery time.

Another source of differential noise appearing on the digit-sense conductors which must be compensated before sensing switching currents during a read portion of a memory cycle is ground plane image current noise. In prior two wire 2D core memory systems, the worst case delta noise recovery time was sufficiently long that image current noise recovery time was not of significant importance. However, with the worst case delta noise compensation provided by the present invention, the image current coupling becomes a worst case limiting factor in decreasing the recovery time between a write portion of a memory cycle and the read portion of the following memory cycle.

Figure 7:
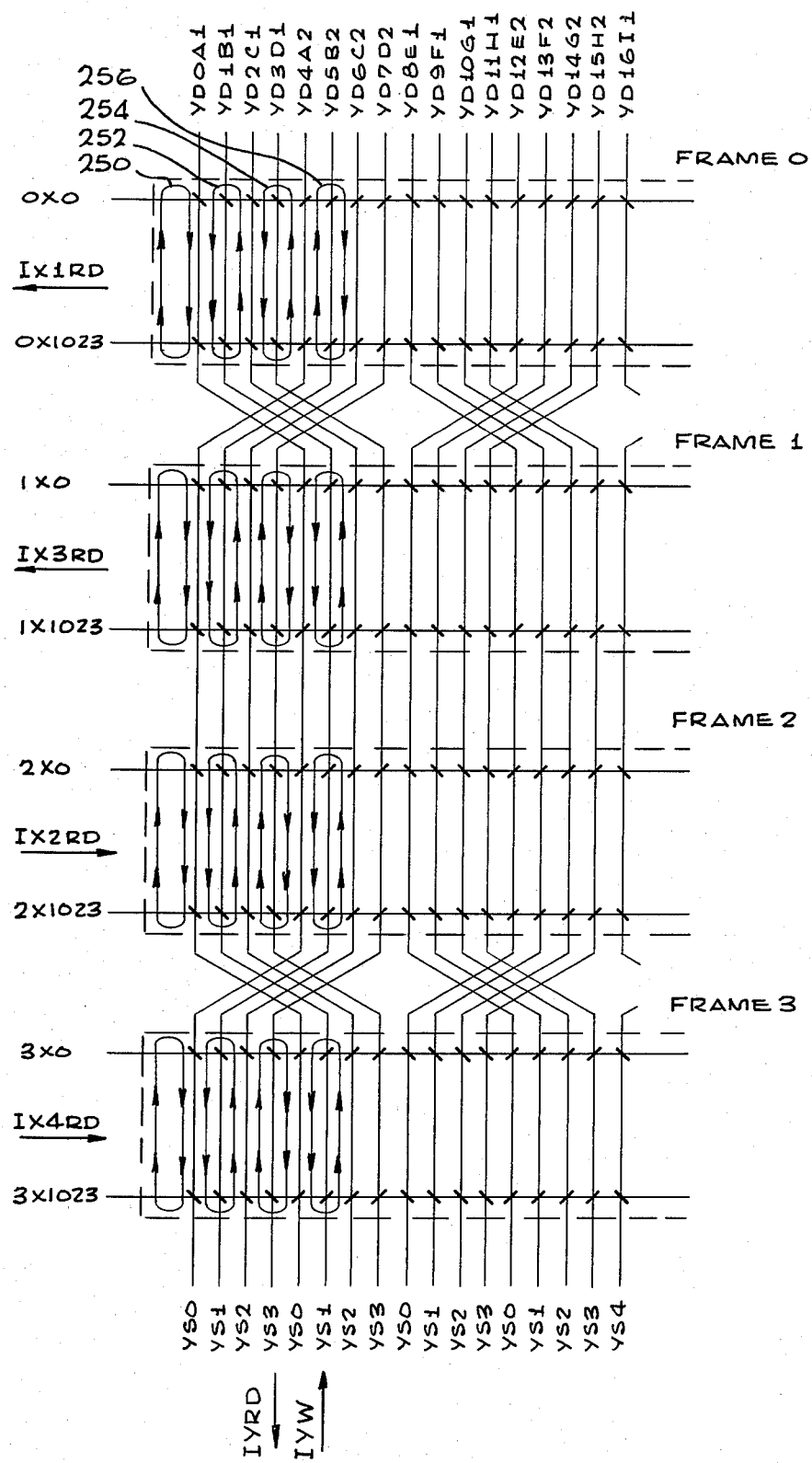
FIG. 7 is a simplified schematic diagram of an alternative arrangement of a core memory system in accordance with the invention.

Referring now to FIG. 7, there is shown a simplified representation of part of the magnetic portion of a core memory in accordance with the present invention.

The notation used in FIG. 7 identifies the Y conductors at their sink end by a letter Y indicating a Y conductor, a letter S indicating a sink end, and a number which increases sequentially from left to right according to the physical position of the conductor at the outer edge of frame 3. On the drive end, the conductors are identified by the letter Y to indicate a Y conductor, by the letter D to indicate the drive end, by a number which increases sequentially from left to right according to the physical position of the conductor at the outer edge of frame 0, by a letter which uniquely identifies a corresponding active pair of conductors and by a second number 1 or 2 which identifies a first or second conductor of a conductor pair. The X conductors are identified only at the left end by a number indicating the frame to which the X conductor belongs, a letter X identifying a conductor, and a number indicating the sequential physical position of the X conductor within the frame. The read current directions for the Y conductors and for the X conductors within each frame are indicated by arrows for convenient reference.

Ground plane image currents resulting from a write current through digit-sense conductor YD0A1 are represented by major ground plane current loops 250 and 252 in frame 0. Major ground plane image currents resulting from a write current through digit-sense conductor YD4A2 are represented by ground plane current loops 254 and 256. It will be observed that only the left-most portion of the left-most bit position is illustrated in FIG. 7, this portion being representative of other portions of the memory. Furthermore, it will be understood that the simple major current loops 250, 252, 254 and 256 are only representative of actual image current patterns which are more complex than a simple loop. Similar ground plane image currents are represented by current loops in frames 1, 2 and 3.

As write current flows through the selected digit-sense conductors, the ground plane image currents are generated and couple into other nearby digit-sense conductors. If the next memory cycle involves digit-sense conductors that are physically remote from the digit-sense conductors for the just finishing memory cycle, there is very little coupling between the image current caused by the drive current of the just finishing memory cycle and the remote, next active digit-sense conductors. Consequently, there is very little effect upon memory speed. However, a core memory must be designed to operate at a speed which will accommodate worst case conditions. For example, a first cycle might involve conductors YD0A1 and YD4A2 while a next cycle might involve conductors YD2C1 and YD6C2. In frame 0, ground plane image currents from both first write currents in conductor YD0A1 and in conductor YD4A2 couple into conductor YD2C1 while much less ground plane image current couples into its mating pair YD6C2. As a result of this imbalance in ground plane image current coupling, a noise imbalance occurs in frame 0 across conductors YD2C1 and YD6C2. Under a conventional memory arrangement, similar noise coupling imbalances would occur in frames 1, 2 and 3 and this differential noise would be additive with the noise occurring in frame 0.

However, in accordance with the present invention, the digit-sense conductors are divided into adjacent groups of 8 conductors each, with each group being further divided into a first subgroup of 4 adjacent conductors and a second subgroup of 4 adjacent conductors. The two conductors of each digit-sense conductor pair occupy corresponding positions in the 2 subgroups of a group of conductors. For example, conductors YD0A1 through YD7D2 form a first group with conductors YD0A1 through YD3D1 forming a first subgroup within the first group and conductors YD4A2 through YD7D2 forming a second subgroup within the first group. Conductor YD0A1 is physically located as the left-most conductor of the first subgroup while its active counterpart of a conductor pair is conductor YD4A2 which is physically located as the left-most conductor of the second subgroup. Each conductor of a digit-sense conductor pair has a corresponding physical position in a different subgroup of a group of conductors.

The coupling noise cancellation is attained by maintaining the relative physical position of each conductor within a subgroup while crossing all of the conductors of the first subgroup with all of the conductors of the second subgroup within each group between frames 0 and 1 and again between frames 2 and 3. The crossover occurring between frames 2 and 3 restores the physical location of the conductors to the same relative positions in frame 3 as they occupy in frame 0. Thus, the frames or arrays, as well as the digit-sense conductors, are provided in pairs with the pairs of digit-sense conductor subgroups of a group being arranged to have a different current carrying conductor of each digit-sense pair in the group. The individual conductors of each digit-sense conductor pair have corresponding relative positions in the subgroups with the subgroup pairs having first and opposite juxtapositions in first and second frames or arrays respectively of a pair of frames or arrays.

As a result of these multiple conductor subgroup crossovers, the differential coupling noise resulting from frame 0 is matched by opposite polarity similar amplitude differential coupling noise in frame 2 while coupling noise in frame 1 is compensated by opposite polarity differential coupling noise in frame 3. Thus, for each frame having a first juxtaposition, there is a second frame with an opposite juxtaposition providing compensatory image current coupling noise. The crossovers provide noise compensation even between conductors of different, but adjacent groups of conductors. For example, if conductors YD3D1 and YD7D2 are selected during a first memory cycle and conductors YD8E1 and YD12E2 are selected during a next memory cycle, there will be very little coupling of conductor YD3D1 in frames 0 and 3 into either of the conductors for the next memory cycle. However, in frames 0 and 3 conductors YD7D2 will couple strongly into conductor YD8E1 and very weakly if at all into conductor YD12E2. However, just the opposite effect occurs in frames 1 and 2 where conductor YD3D1 couples strongly into conductor YD12E2 and very weakly if at all into conductor YD8E1. Balanced image current noise thus couples into digit-sense conductor pair YD8E1 and YD12E2.

The number of conductors in each subgroup does not substantially affect this compensation arrangement except that if the number of conductors becomes much greater than 4 the manufacturing difficulty of providing the Y conductor crossovers during the stringing of the memory increases substantially.

It may be noted that the coupling of balanced electrical noise signals described above presumes the occurrence of equal, parallel currents in any activated pair of digit-sense conductors. The effectiveness of this noise compensation is thus substantially reduced when equal parallel currents do not flow through a pair of digit-sense conductors. With the control and timing scheme described in FIG. 6, the 4 bits corresponding to each pair of digit-sense conductors are written 2 at a time in 2 successive write operations by individually controlling the currents in each digit-sense conductor of a conductor pair. However, it has been found that where 4 bits are to be written for each conductor pair the memory operating speed can be maximized by maintaining equal currents in each conductor of a conductor pair and writing the 4 bits sequentially in 4 separate write operations. It has been found that the reduction of noise recovery time which results from crossing over the digit-sense conductor subgroups while maintaining the same relative conductor positions within each subgroup and the use of balanced current pairs more than offsets the increased time required to write in four sequential operations instead of two.

Figure 8:
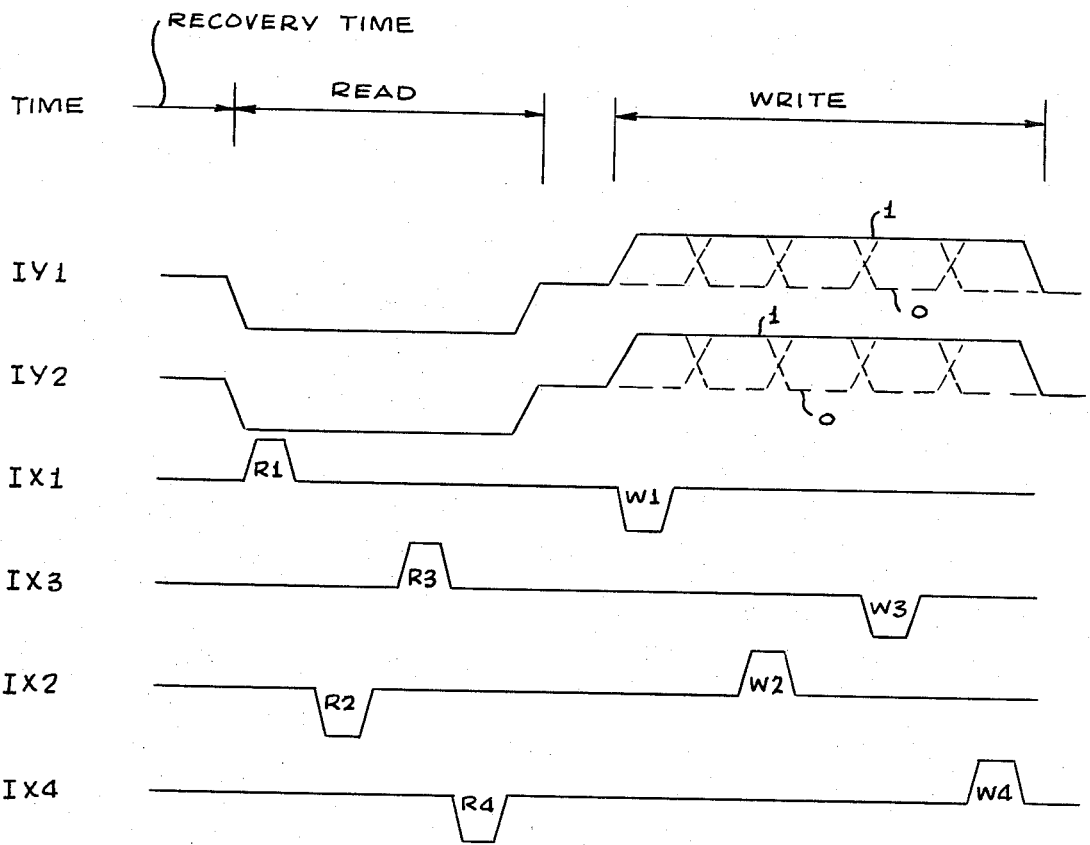
FIG. 8 is an alternative timing diagram for the alternative arrangement of a core memory system shown in FIG. 7.

A typical read/write cycle for the crossover compensating memory configuration is illustrated in FIG. 8. During a read portion of a memory cycle equal parallel currents IY1 and IY2 pass through a pair of digit-sense Y conductors while sequantial, nonoverlapping read currents are passed through one X conductor for each frame. The polarity representations are rather arbitrarily chosen with a current flow from sink end to drive end being assigned a positive representation in FIG. 8. Similarly, during the wire portion of a memory cycle the 4 bit positions, one from each frame are written sequentially with write current in the selected digit-sense pair of conductors being activated or nonactivated together depending upon the information content of the bit being written.

While the timing and control circuits required to implement the alternative timing patterns illustrated in FIG. 8 have not been explicitly shown, the slight modifications of the arrangement shown in FIG. 1 for this implementation will be readily apparent to a person of ordinary skill in the art. For example, for a write cycle the 4:2 multiplexers MX0 through MX4 will be replaced by 4:1 multiplexers MX0 through MX4 respectively and will respond to write control signals identifying four separate portions of a memory cycle rather than only two separate portions. In addition, the pair of conductors extending from the multiplexers to the common cathode portions of the switches may be connected together to cause each conductor of a digit-sense conductor pair to conduct or not conduct together. As desired, either the overlapped read currents as described in conjunction with FIGS. 6A and 6B or the nonoverlapped read currents as described in conjunction with FIG. 8 may be used during a read portion of a memory cycle. Furthermore, the overall operating speed of the memory may be increased in accordance with the alternative arrangement of the invention.

Figure 9:
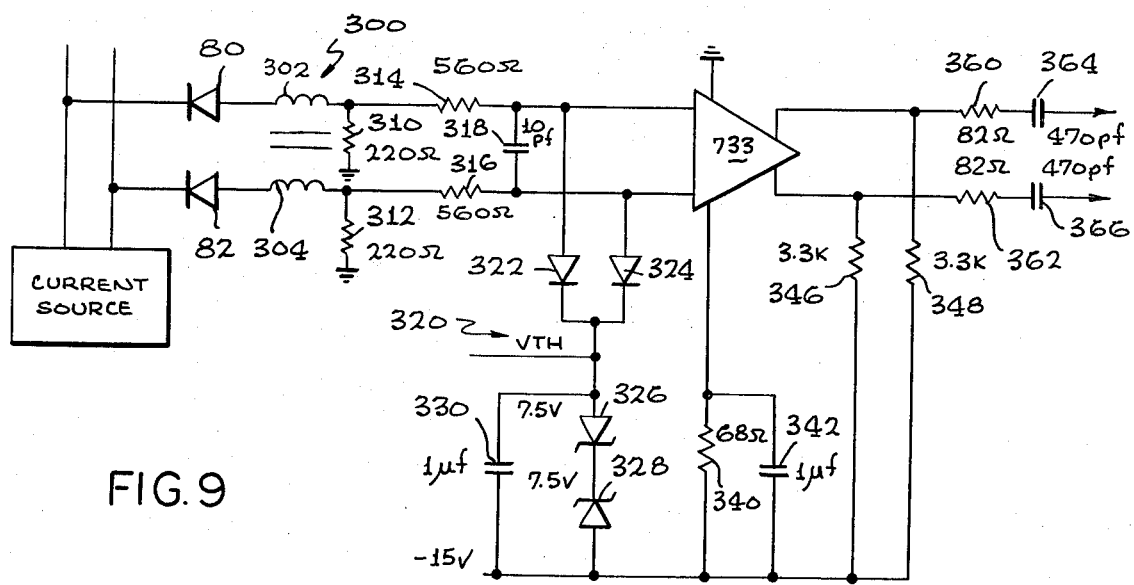
FIG. 9 is an alternative arrangement of a portion of a sense amplifier for use in a core memory according to the invention.

FIG. 9 illustrates an improved sense amplifier for the improved, faster memory illustrated in FIGS. 7 and 8. A balun transformer 300 is inserted with separate windings 302, 304 coupled to diodes 80, 82 respectively. Resistors 310, 312 of 220 ohms each couple the opposite ends of windings 302, 304 respectively. Balun 300, along with resistors 310, 312 provides an improved common mode rejection at the input to the sense amplifier. The output ends of windings 302, 304 are coupled through a low pass filter formed by 560 ohm resistors 314, 316 and 10 pf capacitor 318 to the inputs of a 733 differential comparator, which is set for a selected gain of 10 to maximize its operating speed.

A bias network 320 includes coupling diodes 322, 324, 7.5 volt common anode series connected diodes 326, 328 and a 1 microfarad filter capacitor 330 providing a coupling to −15 volts. Resistor 340 and capacitor 342 provide a filtered power supply to the 733 comparator.

The differential outputs of the 733 comparator are coupled respectively through 3.3 K resistors 346, 348 to −15 volts and also through low pass filters provided by 82 ohm resistors 360, 362 and 470 pf capacitors 364, 366. The remainder of the sense amplifier has not been specifically shown. It is the same as the sense amplifier shown in FIG. 2 with capacitors 364, 366 being coupled to diode bridge circuit 56 and intermediate amplifier stage 58 to comparator 60 as shown in FIG. 2.

The operation of the sense amplifier shown in FIG. 9 is substantially the same as the sense amplfer shown in FIG. 2 and previously described except that balun transformer 300 provides improved common mode noise rejection and the 733 comparator provides faster operating speed.

While there has been shown and described above a particular arrangement of a core memory in accordance with the invention, for the purpose of enabling a person of ordinary skill in the art to make and use the invention, it will be appreciated that the invention is not limited thereto. Accordingly, any modifications, variations, or equivalent arrangements within the scope of the attached claims should be considered to be within the scope of the invention.

What is claimed is:

1. A two wire core memory comprising:
   at least two arrays of magnetic memory cores which are switchable between different states of magnetization;
   a plurality of word conductors for each array, each word conductor inductively coupling a plurality of cores in an array;
   at least two groups of digit-sense conductors inductively coupling a plurality of cores from each array, each group including two subgroups of at least one digit-sense conductor each with digit-sense conductors which occupy corresponding physical positions in each subgroup of a group forming a digit-sense conductor pair, the subgroups of each group occupying a first relative position within one array and being crossed over one another between the same two arrays to occupy a relative position opposite the first relative position in a second array different from the one array, the at least one digit-sense conductor within each subgroup occupying the same relative physical positions in the subgroup in both the first and second arrays; and
   control circuitry that is operative during a memory cycle to provide coincident selection by passing a current through a word conductor and a balanced pair of currents through a pair of digit-sense conductors tending to switch at least one selected core in the memory.

2. The core memory according to claim 1 above, further comprising a sense amplifier that is coupled for operation during a read portion of a memory cycle to sense a core switching signal differentially across a pair of current carrying digit-sense conductors.

3. The core memory according to claim 1 above, wherein the memory is a two wire 2½ D memory having each core coupled by a unique combination of one word conductor and one digit-sense conductor with the core orientations selected such that a given one of a pair of cores coupled by one word conductor and a pair of digit-sense conductors may be selected by the relative current directions in the word and digit-sense conductors.

4. The core memory according to claim 3 above, wherein the control circuitry is operative during a memory cycle to sequentially select one core each from the first and second arrays which inductively couples a given digit-sense conductor, the selected cores being partially selected by word conductor currents in the first and second arrays which have opposite polarities relative to the currents in the given pair of digit-sense conductors.

5. The core memory according to claim 3 above, wherein the control circuitry is operative during a memory cycle to sequentially select one core each from the first and second arrays, the selected cores in the first and second arrays inductively coupling different conductors of a given digit-sense conductor pair.

6. The core memory according to claim 5 above, wherein the control circuitry includes circuitry operative during a memory cycle to first read sequentially and then write sequentially the selected cores in the first and second arrays.

7. The core memory according to claim 1 above, wherein the memory comprises first through fourth arrays disposed sequentially along the digit-sense conductors, the subgroups of each group of digit-sense conductors being crossed over between the first and second arrays and between the third and fourth arrays with no crossover between the second and third arrays.

8. A two wire, one core per bit core memory comprising pairs of arrays of magnetic memory cores; a plurality of word conductors for each array, each word conductor inductively coupling a plurality of cores in an array and a plurality of digit-sense conductors coupled to carry partial selection currents in parallel equal magnitude pairs during each read and each write portion of each memory cycle, all of the digit-sense conductors being disposed in subgroup pairs arranged to provide current carrying conductor pairs in respective corresponding relative positions in the subgroups with all of the subgroup pairs having first and opposite juxtapositions in first and opposite arrays respectively of a pair of arrays to achieve noise cancellation with the two conductors of each nonselected digit-sense conductor pair having equal and balanced electrical noise signals coupled thereto from a pair of digit-sense conductors selected during a memory cycle.

* * * * *